United States Patent
Qin et al.

(10) Patent No.: US 12,543,465 B2
(45) Date of Patent: Feb. 3, 2026

(54) OLED DISPLAY PANEL AND DISPLAY APPARATUS HAVING SAME

(71) Applicants: Chengdu BOE Optoelectronics Technology Co., Ltd., Sichuan (CN); BOE Technology Group Co., Ltd., Beijing (CN)

(72) Inventors: Songlv Qin, Beijing (CN); Wei Zhang, Beijing (CN); Yanqiu Zhao, Beijing (CN); Longhui Xue, Beijing (CN); Rui Zhou, Beijing (CN); Quan Shi, Beijing (CN); Weiyun Huang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 463 days.

(21) Appl. No.: 17/921,539

(22) PCT Filed: Jun. 8, 2021

(86) PCT No.: PCT/CN2021/098967
§ 371 (c)(1),
(2) Date: Oct. 26, 2022

(87) PCT Pub. No.: WO2022/017030
PCT Pub. Date: Jan. 27, 2022

(65) Prior Publication Data
US 2023/0189602 A1 Jun. 15, 2023

(30) Foreign Application Priority Data
Jul. 23, 2020 (CN) .......................... 202010717040.3

(51) Int. Cl.
*H10K 59/35* (2023.01)

(52) U.S. Cl.
CPC ................................. *H10K 59/353* (2023.02)

(58) Field of Classification Search
CPC .. H10K 59/353; H10K 59/352; H10K 59/122; H10K 71/166; H10K 2102/351; H10K 50/8428; H10K 71/164
See application file for complete search history.

(56) References Cited

U.S. PATENT DOCUMENTS

| | | |
|---|---|---|
| 2016/0254476 A1 | 9/2016 | Park |
| 2021/0135149 A1 | 5/2021 | Xin et al. |

FOREIGN PATENT DOCUMENTS

| | | |
|---|---|---|
| CN | 107871774 A | 4/2018 |
| CN | 108754419 A | 11/2018 |

(Continued)

OTHER PUBLICATIONS

PCT/CN2021/098967 international search report.
CN 202010717040.3 first office action.

*Primary Examiner* — Elmito Breval
(74) *Attorney, Agent, or Firm* — IPro, PLLC

(57) ABSTRACT

An OLED display panel (100) and a display apparatus having same. The OLED display panel (100) includes a substrate (1), a pixel layer (2) and a separating and supporting layer (3). The pixel layer (2) includes a plurality of pixel-unit groups (21). The separating and supporting layer (3) includes a plurality of supporting-block groups (31). The thickness of the supporting blocks (311) is greater than the thickness of the third sub-pixels (211c). When the third sub-pixels (211c) are formed by evaporation by using a mask (101), the supporting blocks (311) are suitable to support between the substrate (1) and the mask (101), to isolate the substrate (1) and the mask (101). The supporting- (Continued)

block groups (31) are disposed on at least one side of the third sub-pixel (211*c*) of each of the pixel-unit groups (21) in the first direction.

11 Claims, 4 Drawing Sheets

(56) References Cited

FOREIGN PATENT DOCUMENTS

| | | |
|---|---|---|
| CN | 109166883 A | 1/2019 |
| CN | 110752243 A | 2/2020 |
| CN | 111799315 A | 10/2020 |
| JP | 2009276774 A | 11/2009 |

OLED DISPLAY PANEL AND DISPLAY APPARATUS HAVING SAME

CROSS REFERENCE TO RELEVANT APPLICATIONS

The present application is filed on the basis of and claims the priority of the Chinese patent application filed on Jul. 23, 2020 with the application number of 202010717040.3, which is hereby incorporated herein in its entirety by reference.

TECHNICAL FIELD

The present application relates to the technical field of displaying and, more particularly, to an OLED display panel and display apparatus having same.

BACKGROUND

Organic Light Emitting Diode (OLED) display panels have the advantages such as a wide color gamut, a low thickness, a high contrast, bendable and a low electricity consumption. Currently, the pixel layer of OLEDs is formed by vacuum evaporation of an organic material by using a Fine Metal Mask (FMM). In the evaporation, under the action of a magnetic partition plate, the substrate and the high-precision metal mask are adhered, and subsequently different EL materials are evaporated to different positions on the substrate.

However, the strip-shaped high-precision metal mask itself has a high fluidity, and, in the evaporation, easily deviates when influenced by factors such as magnetic force, static electricity and EL material accumulation, which easily results in imperfects such as FMM damage and color mixing, seriously restricts the application of FMM, and results in a low yield of OLED display panel products.

SUMMARY

The present application aims at solving at least one of the technical problems in the prior art. In view of the above, the present application provides an OLED display panel, wherein the separating and supporting layer of the OLED display panel may effectively support the mask, which reduces imperfects, and improves the yield of the product.

The present application further provides a display apparatus having the OLED display panel stated above.

An OLED display panel according to the first aspect of the present application includes: a substrate;
a pixel layer, wherein the pixel layer is disposed on one side of the substrate in a thickness direction of the substrate and includes a plurality of pixel-unit groups, the plurality of pixel-unit groups are disposed sequentially in a first direction, each of the pixel-unit groups includes a plurality of pixel units that are arranged in a second direction, and each of the pixel units includes a first sub-pixel, a second sub-pixel and a third sub-pixel, wherein the second direction is perpendicular to the first direction; and
a separating and supporting layer, wherein both of the separating and supporting layer and the pixel layer are disposed on a same one side of the substrate in the thickness direction of the substrate and are disposed on a surface of the substrate, the separating and supporting layer includes a plurality of supporting-block groups, the plurality of supporting-block groups are disposed sequentially in the first direction, each of the supporting-block groups includes a plurality of supporting blocks that are arranged in the second direction, a thickness of each of the supporting blocks is greater than a thickness of the third sub-pixel, when the third sub-pixel is formed by evaporation by using a mask, the supporting blocks are suitable to support between the substrate and the mask, to isolate the substrate and the mask, and a plurality of third sub-pixel of each of the pixel-unit groups are suitable to correspond to one opening of the mask;
wherein the supporting-block groups are disposed on at least one side of the third sub-pixel of each of the pixel-unit groups in the first direction.

In the OLED display panel according to the present application, by disposing the supporting-block groups on at least one side of the third sub-pixels of each of the pixel-unit groups in the first direction, the supporting-block groups and the openings of the mask are staggered, whereby the supporting-block groups may better support the mask, which ensures that the evaporation may be normally performed, and effectively reduces imperfects such as mura, thereby increasing the yield of the product.

In some embodiments, the supporting-block groups are disposed on two sides of the third sub-pixel of each of the pixel-unit groups in the first direction.

In some embodiments, a plurality of first sub-pixels and a plurality of second sub-pixels of each of the pixel-unit groups are disposed sequentially alternately along a first reference line, and a plurality of third sub-pixels of each of the pixel-unit groups are disposed sequentially along a second reference line, wherein the second reference line and the first reference line are parallel and both extend in the second direction.

In some embodiments, in the first direction, a plurality of first reference lines and a plurality of second reference lines are disposed sequentially alternately.

In some embodiments, in the first direction, one of the supporting-block groups is disposed between the first reference line and the second reference line that correspond to the pixel-unit group.

In some embodiments, in the first direction, the supporting-block groups are disposed between two neighboring pixel-unit groups.

In some embodiments, in the first direction, all of centers of the plurality of supporting blocks of the supporting-block groups are located in the first reference line.

In some embodiments, in the first direction, the supporting-block groups are disposed between the first reference line and the second reference line of each of the pixel-unit groups, and the supporting-block groups are disposed between each two neighboring pixel-unit groups.

In some embodiments, two supporting-block groups located on two sides of the pixel-unit groups in the first direction are a first supporting-block group and a second supporting-block group, and the supporting blocks of the first supporting-block group and corresponding supporting blocks of the second supporting-block group individually flush in the second direction.

In some embodiments, two supporting-block groups located on two sides of the pixel-unit groups in the first direction are a first supporting-block group and a second supporting-block group, and the supporting blocks of the first supporting-block group and the supporting blocks of the second supporting-block group are individually staggered in the second direction.

In some embodiments, each of the pixel units corresponds to at least one of the supporting blocks; and in the second direction, the plurality of pixel units of the pixel-unit groups and the plurality of supporting blocks of the supporting-block groups are disposed sequentially alternately; or in the second direction, one instance of the supporting blocks is disposed between the first sub-pixel and the second sub-pixel of each of the pixel units.

In some embodiments, the first sub-pixel is a red-color sub-pixel, the second sub-pixel is a green-color sub-pixel, and the third sub-pixel is a blue-color sub-pixel.

A display apparatus according to the second aspect of the present application includes the OLED display panel according to the first aspect of the present application.

The display apparatus according to the present application, by using the OLED display panel stated above, facilitates to increase the yield of the product.

Some of the additional aspects and advantages of the present application will be given in the following description, and some will become apparent from the following description or be known from the implementation of the present application.

Figure 1:
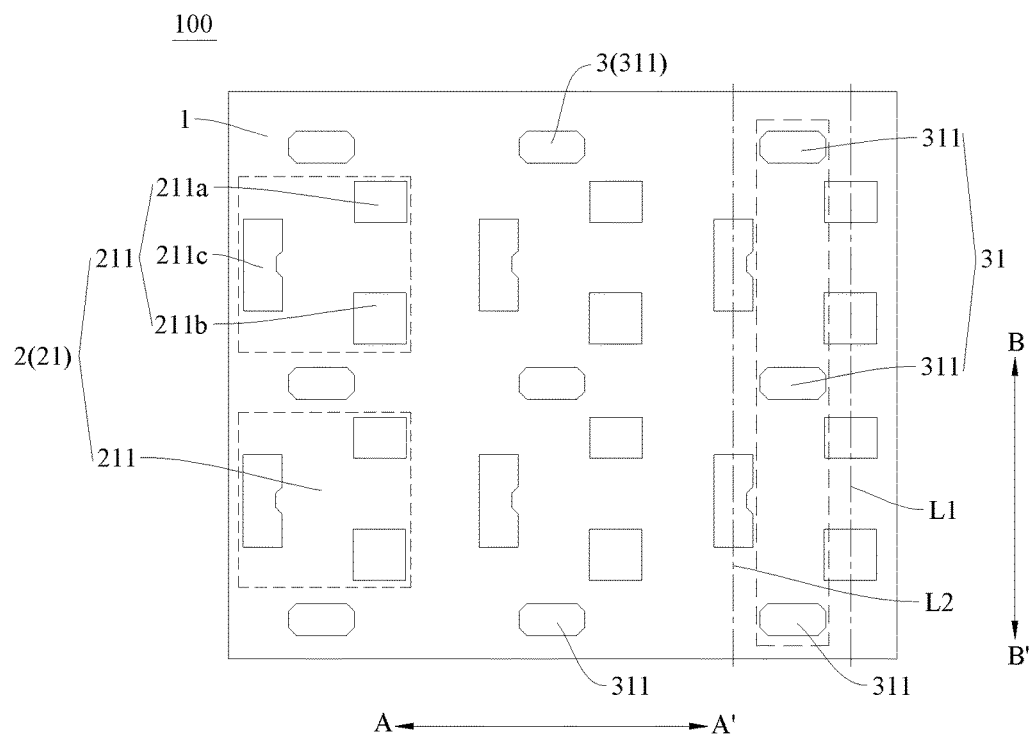
FIG. 1 is a schematic diagram of an OLED display panel according to an embodiment of the present application.

REFERENCE NUMBERS mask 101, openings 101a;
OLED display panel 100, first reference line L1, second reference line L2;
substrate 1;
pixel layer 2, pixel-unit groups 21, pixel units 211;
first sub-pixel 211a, second sub-pixel 211b, third sub-pixel 211c; and
separating and supporting layer 3, supporting-block groups 31, first supporting-block group 31a, second supporting-block group 31b, supporting blocks 311.

DETAILED DESCRIPTION

The embodiments of the present application will be described in detail below, and the examples of the embodiments are illustrated in the drawings, wherein the same or similar reference numbers throughout the drawings indicate the same or similar elements or elements having the same or similar functions. The embodiments described below with reference to the drawings are exemplary, are intended to interpret the present application, and should not be construed as a limitation on the present application.

The disclosure below provides many different embodiments or examples for the implementation of different configurations of the present application. In order to simplify the disclosure of the present application, components and configurations of specific examples will be described below. Certainly, they are merely examples, and are not intended to limit the present application. Furthermore, the present application may repeat the reference numbers and/or letters in the different examples. Such repeating is for the purpose of simplification and clarity, and it does not indicate the relation between the various discussed embodiments and/or configurations. Furthermore, the present application provides examples of various particular processes and materials, but a person skilled in the art may envisage the applicability of other processes and/or the usage of other materials.

An OLED display panel 100 according to an embodiment in the first aspect of the present application will be described below with reference to the drawings.

Figure 2:
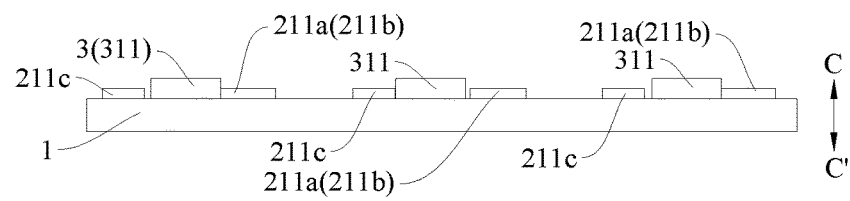
FIG. 2 is another schematic diagram of the OLED display panel shown in FIG. 1.

As shown in FIGS. 1 and 2, the OLED display panel 100 includes a substrate 1 and a pixel layer 2. The pixel layer 2 is disposed on one side of the substrate 1 in the thickness direction (for example, the direction CC' in FIG. 2) of the substrate 1, and the pixel layer 2 includes a plurality of pixel-unit groups 21. The plurality of pixel-unit groups 21 are disposed sequentially in a first direction (for example, the direction AA' in FIG. 1), and each of the pixel-unit groups 21 includes a plurality of pixel units 211 that are arranged in a second direction (for example, the direction BB' in FIG. 1), wherein the second direction is perpendicular to the first direction. Each of the pixel units 211 includes a first sub-pixel 211a, a second sub-pixel 211b and a third sub-pixel 211c. For example, in the example of FIGS. 1 and 4-7, the first sub-pixel 211a is a red-color sub-pixel, the second sub-pixel 211b is a green-color sub-pixel, and the third sub-pixel 211c is a blue-color sub-pixel, which is not limited thereto. The third sub-pixels 211c of the pixel layer 2 may be formed by evaporation by using a mask 101.

In the description of the present application, the meaning of "plurality of" is "two or more".

As shown in FIGS. 1 and 2, the OLED display panel 100 further includes a separating and supporting layer 3. Both of the separating and supporting layer 3 and the pixel layer 2 are disposed on the same one side of the substrate 1 in the thickness direction of the substrate 1, and both of the separating and supporting layer 3 and the pixel layer 2 are disposed on the surface of the substrate 1. The separating and supporting layer 3 includes a plurality of supporting-block groups 31, the plurality of supporting-block groups 31 are disposed sequentially in the first direction, and each of the supporting-block groups 31 includes a plurality of supporting blocks 311 that are arranged in the second direction. The supporting blocks 311 may be separate from the first sub-pixels 211a, the second sub-pixels 211b and the third sub-pixels 211c, which facilitates to reasonably utilize the gaps between two of the first sub-pixels 211a, the second sub-pixels 211b and the third sub-pixels 211c, to improve the flexibility of the arrangement of the supporting blocks 311, and, while on the premise of ensuring that the supporting blocks 311 have a sufficient supporting area, facilitates to reduce the material consumption of the supporting-block groups 31, and reduce the cost. When the third sub-pixels 211c of the pixel layer 2 are formed by evaporation by using a mask 101, because the thickness of the supporting blocks 311 is greater than the thickness of the third sub-pixels 211c, and the supporting blocks 311 are suitable to support between the substrate 1 and the mask 101, the supporting blocks 311 may isolate the substrate 1 and the mask 101, and the supporting blocks 311 may serve to support the mask 101, to prevent loss of the mask 101 (for example, FMM loss) and the generation of particles, which easily happen because the mask 101 easily directly adheres to the surface of the substrate 1, and reduce generation of static electricity, thereby preventing abnormalities such as evaporation color mixing and dislocation.

A plurality of third sub-pixels 211c of each of the pixel-unit groups 21 are suitable to correspond to one opening 101a of the mask 101. The opening 101a extends in the second direction as a strip shape, and accordingly a plurality of openings 101a may be formed in the mask 101, wherein the plurality of openings 101a may be disposed sequentially and separately in the first direction. The plurality of third sub-pixels 211c of each of the pixel-unit groups 21 may form a pixel region, and the pixel region may be evaporated by using the same one opening 101a, which facilitates to increase the area of the openings 101a of the mask, and reduce the difficulty in the evaporation.

The "strip shape" may be understood as that the length of the opening 101a in the second direction is greater than the width of the opening 101a in the first direction. For example, the strip shape may refer to a long circle shape, a rectangular shape and so on.

As shown in FIGS. 1 and 4-7, the supporting-block groups 31 are disposed on at least one side of the third sub-pixel 211c of each of the pixel-unit groups 21 in the first direction. In other words, one supporting-block group 31 is disposed on one side of the third sub-pixels 211c of each of the pixel-unit groups 21 in the first direction, or the supporting-block groups 31 are disposed on two sides of the third sub-pixels 211c of each of the pixel-unit groups 21 in the first direction, or one supporting-block group 31 is disposed on one side in the first direction of the third sub-pixels 211c of at least one group among the plurality of pixel-unit groups 21, and supporting-block groups 31 are disposed on two sides in the first direction of the third sub-pixels 211c of at least one group among the plurality of pixel-unit groups 21. Accordingly, in the evaporation, at least one side in the first direction of each of the openings 101a in the mask 101 supports the supporting-block groups 31. In other words, one side in the first direction of each of the openings 101a in the mask 101 supports one supporting-block group 31, or two sides in the first direction of each of the openings 101a support the supporting-block groups 31, or one side in the first direction of at least one of the plurality of openings 101a supports one supporting-block group 31, and two sides in the first direction of at least one of the plurality of openings 101a support the supporting-block groups 31. Accordingly, the supporting-block groups 31 and the openings 101a are staggered, whereby the supporting-block groups 31 may better support the mask, which ensures the stable supporting to the mask 101 by the separating and supporting layer 3, prevents deviation of the mask 101, reduces color mixing caused by the fluidity of the mask 101, effectively reduces imperfects such as mura, and increases the yield of the product.

Any two groups of the plurality of pixel-unit groups 21 do not share a supporting-block group 31, and accordingly each of the pixel-unit groups 21 corresponds to at least one supporting-block group 31.

In the prior art, a plurality of third sub-pixels 211c of each of the pixel-unit groups 21 corresponds to one opening 101a of the mask 101, and when the third sub-pixels 211c are formed by evaporation by using a mask 101, the supporting-block groups 31 and the pixel-unit groups 21 flush, and each of the supporting blocks 311 of the supporting-block groups 31 is disposed between two neighboring third sub-pixels 211c, whereby the supporting blocks 311 correspond to the openings 101a, and each of the supporting blocks 311 is required to simultaneously support the two sides of the opening 101a in the width direction. At this point the supporting blocks 311 easily have the defect of being incapable of normally supporting the mask, which causes that the evaporation cannot be normally performed. In the present application, by providing the supporting-block groups 31 on at least one side of the third sub-pixels 211c of each of the pixel-unit groups 21 in the first direction, the supporting-block groups 31 and the openings 101a of the mask 101 are staggered, whereby the supporting-block groups 31 may better support the mask, which ensures that the evaporation may be normally performed, and effectively reduces imperfects such as mura, thereby increasing the yield of the product.

Figure 3:
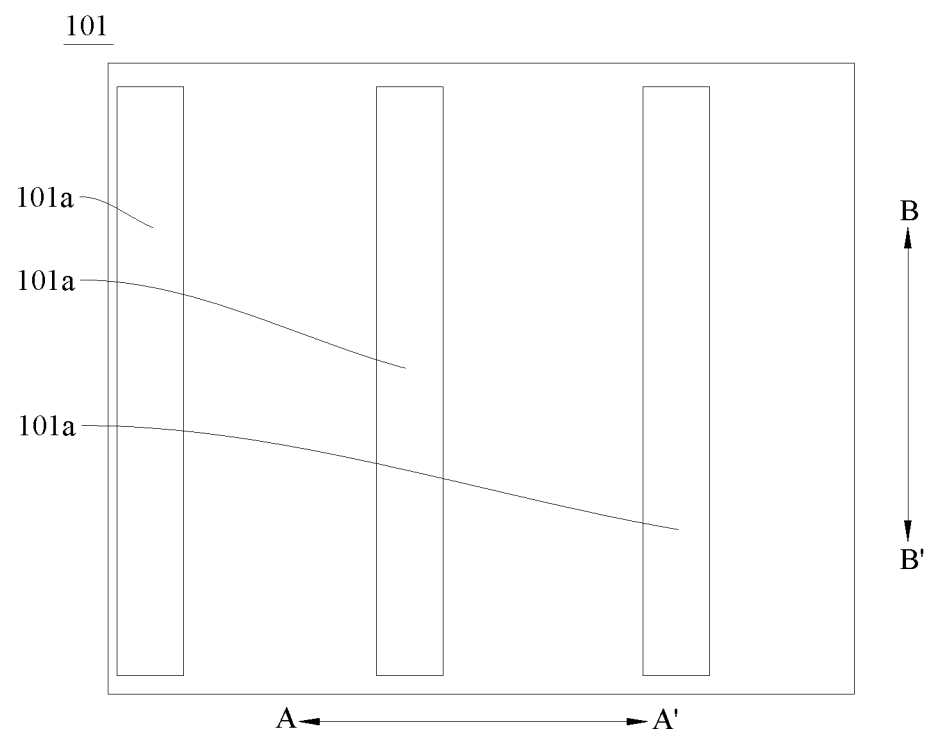
FIG. 3 is a schematic diagram of the mask used by an OLED display panel according to an embodiment of the present application.

As shown in FIGS. 1 and 3, the mask 101 may be an FMM, and the FMM may be of the shape of a Slit, i.e., a Slit FMM. The substrate 1 may be a glass substrate.

It can be understood that the quantity of the supporting blocks 311 of the supporting-block group 31, the quantity of the pixel units 211 of the corresponding pixel-unit group 21, and the arrangement of the supporting blocks 311 of the supporting-block group 31 in the second direction may be configured particularly according to practical applications. For example, in the second direction, a plurality of supporting blocks 311 of a supporting-block group 31 and a plurality of pixel units 211 of a pixel-unit group 21 are disposed alternately (as shown in FIGS. 1 and 4-7). Alternatively, in the second direction, one supporting block 311 is disposed between the first sub-pixel 211a and the second sub-pixel 211b of each of the pixel units 211. Alternatively, in the second direction, the supporting block 311 flushes with one of the first sub-pixel 211a, the second sub-pixel 211b and the third sub-pixel 211c of the corresponding pixel unit 211; for example, in the second direction, the supporting block 311 flushes with the first sub-pixel 211a of the corresponding pixel unit 211, and, accordingly, the supporting block 311 and the first sub-pixel 211a of the corresponding pixel unit 211 may be located in a straight line extending in the first direction. However, the above are not limited.

Figure 5:
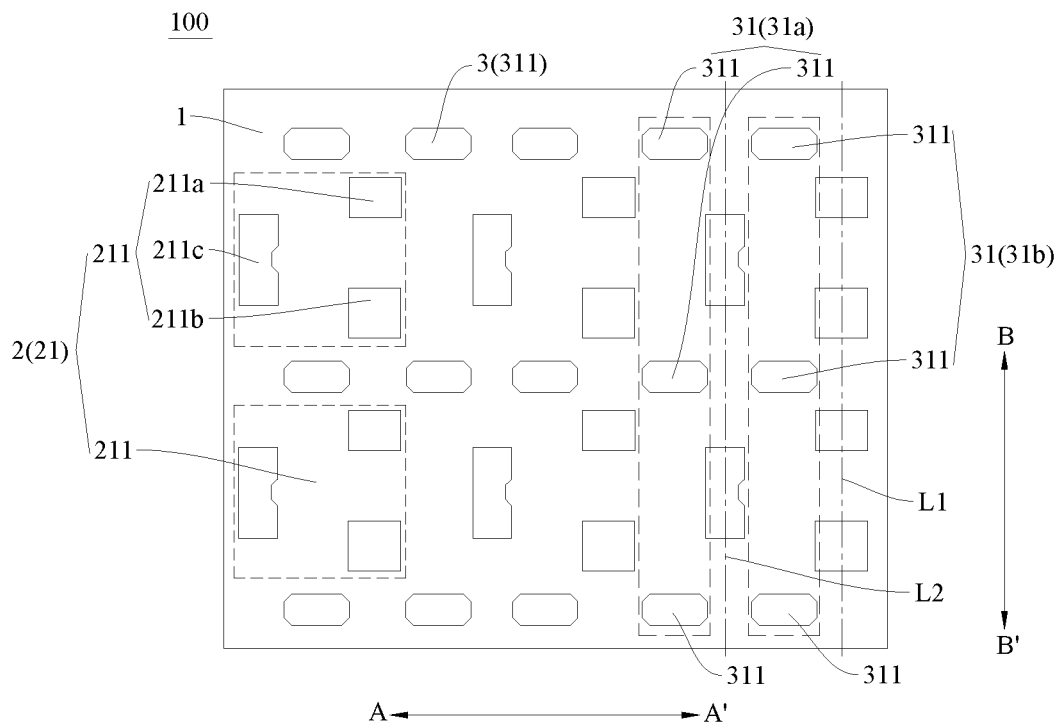
FIG. 5 is a schematic diagram of an OLED display panel according to yet another embodiment of the present application.
Figure 6:
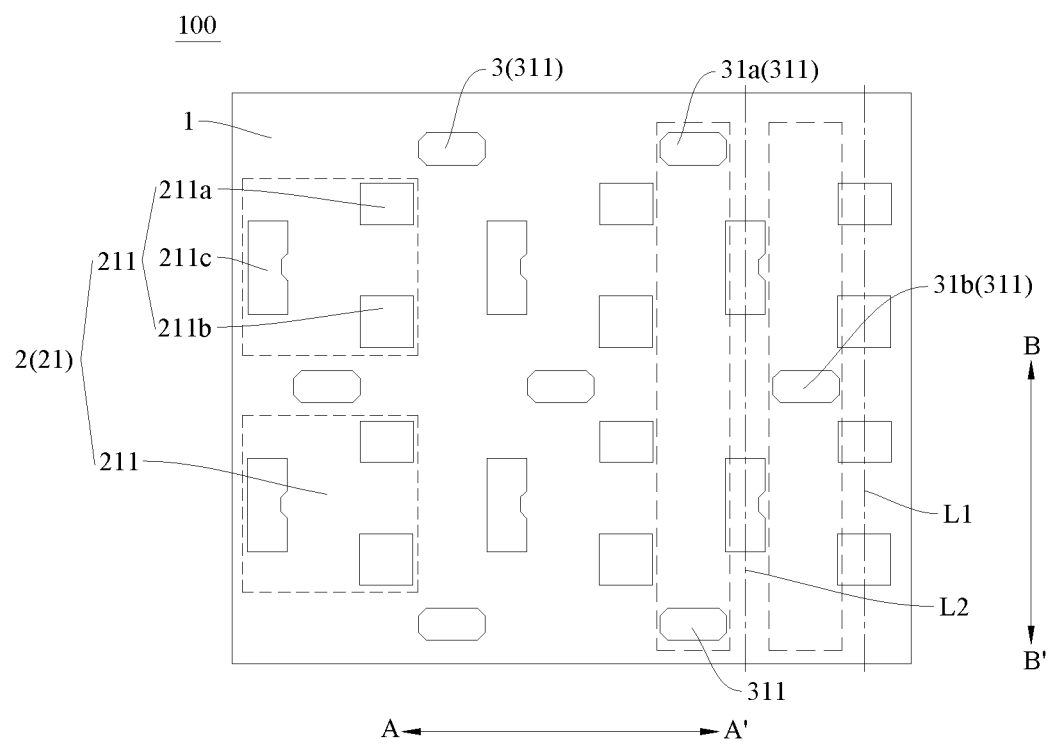
FIG. 6 is a schematic diagram of an OLED display panel according to yet another embodiment of the present application.

In some embodiments, as shown in FIGS. 5 and 6, the supporting-block groups 31 are disposed on two sides of the third sub-pixels 211c of each of the pixel-unit groups 21 in the first direction. Accordingly, the supporting-block groups 31 have a large density of arrangement, which further improves the effect of the supporting to the mask 101 by the separating and supporting layer 3, prevents the mask 101 from directly adhering to the surface of the substrate 1 under the action of static electricity caused by a high fluidity, and further effectively prevents imperfects such as loss of the mask 101, generation of particles and color mixing, thereby facilitating to further increase the yield of the product.

In the examples of FIGS. 5 and 6, the supporting-block groups 31 are disposed on two sides of the third sub-pixels 211c of each of the pixel-unit groups 21 in the first direction, and the third sub-pixels 211c of two neighboring pixel-unit groups 21 do not share a supporting-block group 31.

Certainly, the present application is not limited to what is described above. In some other embodiments, as shown in FIGS. 1, 4 and 7, one supporting-block group 31 is disposed on one side of the third sub-pixels 211c of each of the pixel-unit groups 21 in the first direction, which, while on the premise of ensuring the yield of the product, reduces the quantity of the supporting-block groups 31, which facilitates to simplify the structure of the OLED display panel 100.

Figure 4:
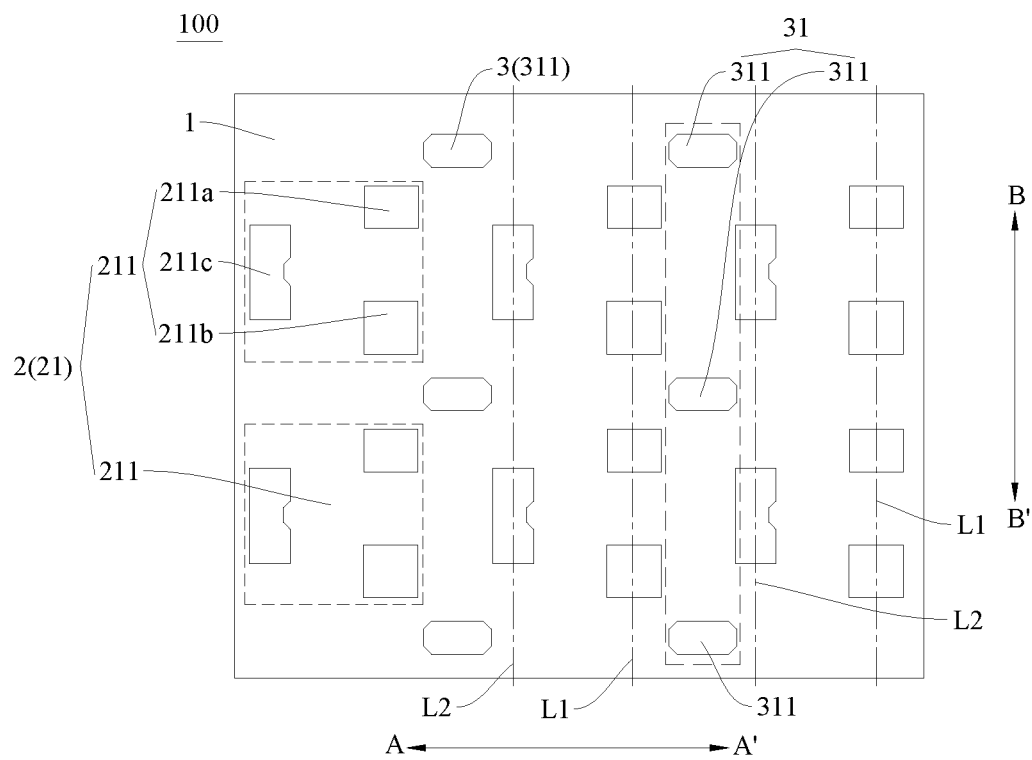
FIG. 4 is a schematic diagram of an OLED display panel according to another embodiment of the present application.
Figure 7:
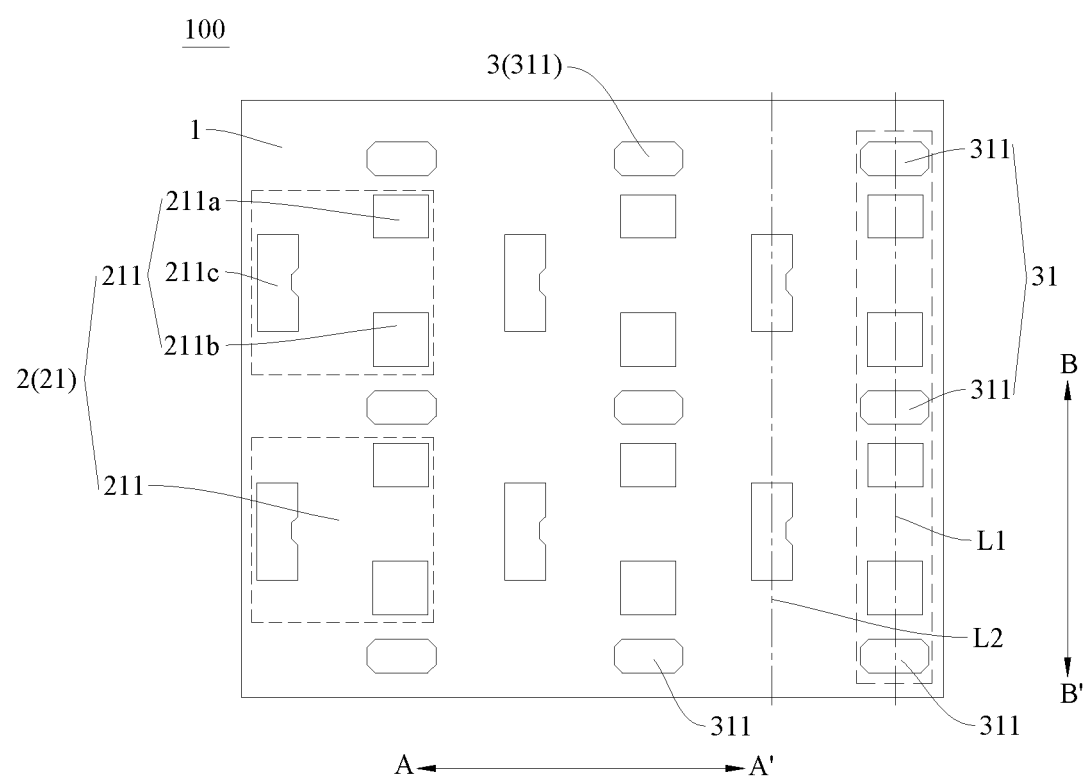
FIG. 7 is a schematic diagram of an OLED display panel according to yet another embodiment of the present application.

In the example of FIGS. 1, 4 and 7, one supporting-block group 31 is disposed on one side of the third sub-pixels 211c of each of the pixel-unit groups 21 in the first direction, and the supporting-block groups 31 are located on the same one side of the third sub-pixels 211c of the corresponding pixel-unit groups 21.

In some embodiments, as shown in FIGS. 1 and 4-7, a plurality of first sub-pixels 211a and a plurality of second sub-pixels 211b of each of the pixel-unit groups 21 are disposed sequentially alternately along a first reference line L1. Accordingly, in an extending direction of the first reference line L1, one second sub-pixel 211b is disposed between two neighboring first sub-pixels 211a of the pixel-unit groups 21, and one first sub-pixel 211a is disposed between two neighboring second sub-pixels 211b. A plurality of third sub-pixels 211c of each of the pixel-unit groups 21 are disposed sequentially along a second reference line L2, wherein the second reference line L2 and the first reference line L1 are parallel and both of the second reference line L2 and the first reference line L1 extend in the second direction. Accordingly, the arrangement of the first sub-pixels 211a, the second sub-pixels 211b and the third sub-pixels 211c of the OLED display panel 100 may form a Slit pixel arrangement, which may prolong the service life of the OLED display panel 100, thereby improving the core competitiveness of the product. For example, the Slit pixel arrangement may prolong the life of the OLED display panel 100 by above 40%.

In some embodiments, as shown in FIGS. 1 and 4-7, in the first direction, a plurality of first reference lines L1 and a plurality of second reference lines L2 are disposed sequentially alternately. Accordingly, in the first direction, one second reference line L2 is disposed between two neighboring first reference lines L1, and one first reference line L1 is disposed between two neighboring second reference lines L2, which ensures that the arrangement of the first sub-pixels 211a, the second sub-pixels 211b and the third sub-pixels 211c of the OLED display panel 100 may form a Slit pixel arrangement, to ensure the service life.

In the example of FIGS. 1 and 4-7, the first sub-pixel 211a is a red-color sub-pixel, the second sub-pixel 211b is a green-color sub-pixel, and the third sub-pixel 211c is a blue-color sub-pixel. Accordingly, the plurality of red-color sub-pixels and green-color sub-pixels of the pixel-unit groups 21 are disposed sequentially alternately along the first reference line L1, the plurality of blue-color sub-pixels of the pixel-unit groups 21 are disposed sequentially along the second reference line L2, the second reference line L2 and the first reference line L1 are separate in the first direction, both of the second reference line L2 and the first reference line L1 are formed as a straight line, and, in the second direction, the blue-color sub-pixel of a pixel unit 211 is located between the red-color sub-pixel and the green-color sub-pixel of the pixel unit 211.

In some embodiments, as shown in FIG. 1, in the first direction, one of the supporting-block group 31 is disposed between the first reference line L1 and the second reference line L2 that correspond to the pixel-unit group 21. Accordingly, in the first direction, the centers of the supporting blocks 311 of the supporting-block group 31 are located between the first reference line L1 and the second reference line L2 of the corresponding pixel-unit group 21, and at this point the arrangement of the supporting-block groups 31 may be that one supporting-block group 31 is disposed on one side of the third sub-pixels 211c of each of the pixel-unit groups 21 in the first direction. The supporting blocks 311 may stably support the solid-material region of the mask 101, to ensure the effect of the supporting to the mask 101 by the separating and supporting layer 3, and reduce deviation of the mask 101 in the first direction, thereby reducing color mixing caused by the fluidity of the mask 101, to ensure the yield of the product.

It can be understood that, when a supporting-block group 31 is located between the first reference line L1 and the second reference line L2 of the corresponding pixel-unit group 21 in the first direction, the quantity of the supporting blocks 311 of the supporting-block group 31, the quantity of the pixel units 211 of the corresponding pixel-unit group 21, and the arrangement of the supporting blocks 311 of the supporting-block group 31 in the second direction may be configured particularly according to practical applications. For example, in the second direction, a plurality of supporting blocks 311 of a supporting-block group 31 and a plurality of pixel units 211 of a pixel-unit group 21 are disposed sequentially alternately (as shown in FIG. 1). Alternatively, in the second direction, at least one supporting block 311 is disposed between the first sub-pixel 211a and the second sub-pixel 211b of each of the pixel units 211. Alternatively, in the second direction, the supporting block 311 flushes with one of the first sub-pixel 211a, the second sub-pixel 211b and the third sub-pixel 211c of the corresponding pixel unit 211.

In some embodiments, as shown in FIG. 4, in the first direction, the supporting-block groups 31 are disposed between two neighboring pixel-unit groups 21. Accordingly, in the first direction, the centers of the supporting blocks 311 of the supporting-block groups 31 are located between two neighboring pixel units 211, and at this point the arrangement of the supporting-block groups 31 may be that one supporting-block group 31 is disposed on one side of the third sub-pixels 211c of each of the pixel-unit groups 21 in the first direction, or one supporting-block group 31 is disposed on one side in the first direction of the third sub-pixels 211c of at least one group among the plurality of pixel-unit groups 21, and supporting-block groups 31 are disposed on two sides in the first direction of the third sub-pixels 211c of at least one group (for example, a pixel-unit group 21 located at the edge of the display panel) among the plurality of pixel-unit groups 21, to ensure the effect of the supporting to the mask 101 by the separating and supporting layer 3, to ensure the yield of the product.

It can be understood that, when a supporting-block group 31 is located between two neighboring pixel-unit groups 21 in the first direction, the quantity of the supporting blocks 311 of the supporting-block group 31, the quantity of the pixel units 211 of the corresponding pixel-unit group 21, and the arrangement of the supporting blocks 311 of the supporting-block group 31 in the second direction may be configured particularly according to practical applications. For example, in the second direction, a plurality of supporting blocks 311 of a supporting-block group 31 and a plurality of pixel units 211 of a pixel-unit group 21 are disposed sequentially alternately (as shown in FIG. 4). Alternatively, in the second direction, at least one supporting block 311 is disposed between the first sub-pixel 211a and the second sub-pixel 211b of each of the pixel units 211. Alternatively, in the second direction, the supporting block 311 flushes with one of the first sub-pixel 211a, the second sub-pixel 211b and the third sub-pixel 211c of the corresponding pixel unit 211.

In some embodiments, as shown in FIG. 7, in the first direction, all of the centers of the plurality of supporting blocks 31 of the supporting-block groups 31 are located in the first reference line L1, to ensure the effect of the supporting to the mask 101 by the supporting blocks 31.

In some embodiments, as shown in FIGS. 5 and 6, in the first direction, the supporting-block group 31 is disposed between the first reference line L1 and the second reference line L2 of each of the pixel-unit groups 21, and in the first direction, the supporting-block group 31 is disposed between each two neighboring pixel-unit groups 21. At this point, the arrangement of the supporting-block groups 31 may be that the supporting-block groups 31 are disposed on two sides of the third sub-pixels 211c of each of the pixel-unit groups 21 in the first direction, to further effectively improve the effect of the supporting to the mask 101 by the separating and supporting layer 3, and prevent the mask 101 from directly adhering to the surface of the substrate 1 under the action of magnetic force, static electricity, EL material accumulation and so on caused by the fluidity, thereby reducing imperfects, and ensuring the yield of the product.

It can be understood that, when the supporting-block groups 31 are disposed on two sides of the third sub-pixels 211c of each of the pixel-unit groups 21 in the first direction, the quantities of the supporting blocks 311 of the supporting-block groups 31 on the two sides and the arrangement of the supporting blocks 311 in the second direction may be configured particularly according to practical applications. Accordingly, the arrangements of the supporting-block groups 31 on the two sides of the third sub-pixels 211c in the first direction may be the same, and may also be different.

In some embodiments, as shown in FIG. 5, two supporting-block groups 31 located on two sides of the pixel-unit groups 21 in the first direction are a first supporting-block group 31a and a second supporting-block group 31b, and the supporting blocks 311 of the first supporting-block group 31a and the corresponding supporting blocks 311 of the second supporting-block group 31b individually flush in the second direction. Accordingly, each of the supporting blocks 311 of the first supporting-block group 31a and the corresponding supporting block of the second supporting-block group 31b may be located in a straight line extending in the first direction. In this case, the quantity of the supporting blocks 311 of the first supporting-block group 31a and the quantity of the supporting blocks 311 of the second supporting-block group 31b may be equal, so that the arrangement mode of the plurality of supporting blocks 311 of the first supporting-block group 31a and the arrangement mode of the plurality of supporting blocks 311 of the second supporting-block group 31b are the same, which facilitates to simplify the arrangement mode of the supporting blocks 311, to enable the supporting blocks 311 to be regularly arranged, to facilitate the processing of the supporting-block groups 31.

In some embodiments, as shown in FIG. 6, two supporting-block groups 31 located on two sides of the pixel-unit groups 21 in the first direction are a first supporting-block group 31a and a second supporting-block group 31b, and the supporting blocks 311 of the first supporting-block group 31a and the supporting blocks 311 of the second supporting-block group 31b are individually staggered in the second direction. In this case, the arrangement mode of the plurality of supporting blocks 311 of the first supporting-block group 31a and the arrangement mode of the plurality of supporting blocks 311 of the second supporting-block group 31b are different, and the quantity of the supporting blocks 311 of the first supporting-block group 31a and the quantity of the supporting blocks 311 of the second supporting-block group 31b are equal or unequal, which, while ensuring the action of supporting of the separating and supporting layer 3, facilitates to reduce the quantity of the supporting blocks 311, simplify the structure of the OLED display panel 100, and reduce the cost.

For example, in the example of FIG. 6, in the second direction, each of the supporting blocks 311 of the first supporting-block group 31a is located between two neighboring supporting blocks 311 of the second supporting-block group 31b, and each of the supporting blocks 311 of the second supporting-block group 31d is located between two neighboring supporting blocks 311 of the first supporting-block group 31a, which may also enable the supporting blocks 311 to be regularly arranged.

Certainly, the arrangement mode of the plurality of supporting blocks 311 of the first supporting-block group 31a and the arrangement mode of the plurality of supporting blocks 311 of the second supporting-block group 31b are not limited to what is described above. For example, the quantity of the supporting blocks 311 of the first supporting-block group 31a is less than the quantity of the supporting blocks 311 of the second supporting-block group 31b, each of the supporting blocks 311 of the first supporting-block group 31a and some of the supporting blocks 311 of the second supporting-block group 31b flush in the second direction, and the other supporting blocks 311 of the second supporting-block group 31b and the supporting blocks 311 of the first supporting-block group 31a are individually staggered in the second direction.

In some embodiments, as shown in FIGS. 1 and 4-7, each of the pixel units 211 corresponds to at least one of the supporting blocks 311. Accordingly, the supporting blocks 311 have a suitable density of arrangement, to ensure the effect of the supporting to the mask 101 by the separating and supporting layer 3.

For example, as shown in FIGS. 1 and 4-7, in the second direction, the plurality of pixel units 211 of the pixel-unit groups 21 and the plurality of supporting blocks 311 of the supporting-block groups 31 are disposed sequentially alternately, to reasonably utilize the gaps between the neighboring pixel units 211, to facilitate the arrangement of the supporting blocks 311. As another example, in the second direction, one supporting block 311 is disposed between the first sub-pixel 211a and the second sub-pixel 211b of each of the pixel units 211, to reasonably utilize the gap between the first sub-pixel 211a and the second sub-pixel 211b, to facilitate the arrangement of the supporting blocks 311.

In some embodiments, the cross-sectional area of the supporting block 311 gradually decreases in the direction toward close to the substrate 1, so that the cross-sectional area of the end of the supporting block 311 that is away from the substrate 1 is larger, to ensure that there is a large contact area between the supporting block 311 and the mask 101, and ensure the action of the supporting to the mask 101 by the supporting block 311, to enable the separating and supporting layer 3 to effectively support the mask 101, and reduce imperfects such as color mixing and dislocation. The cross-section of the supporting block 311 may be parallel to the surface of one side of the substrate 1 in the thickness direction.

For example, at least one of the orthographic projection of the supporting block 311 in the first direction and the orthographic projection of the supporting block 311 in the second direction is formed as a trapezoid, and because the cross-sectional area of the supporting block 311 gradually decreases in the direction toward close to the substrate 1, at least one of the orthographic projection of the supporting block 311 in the first direction and the orthographic projection of the supporting block 311 in the second direction may be formed as an inversed trapezoid, whereby the supporting block 311 has a simple structure, and is easy to process.

A display apparatus according to an embodiment in the second aspect of the present application includes the OLED display panel 100 according to the embodiments in the first aspect of the present application. For example, the display apparatus may further include a housing, and the OLED display panel 100 is disposed at the housing.

The display apparatus according to the embodiments of the present application, by using the OLED display panel 100 stated above, facilitates to increase the yield of the product.

The other components and operations of the display apparatus according to the embodiments of the present application are known to a person skilled in the art, and are not described in detail herein.

In the description of the present application, it should be understood that the terms that indicate orientation or position relations, such as "central", "transverse", "length", "width" and "thickness", are based on the orientation or position relations shown in the drawings, and are merely for conveniently describing the present application and simplifying the description, rather than indicating or implying that the device or element must have the specific orientation and be constructed and operated according to the specific orientation. Therefore, they should not be construed as a limitation on the present application.

Furthermore, the terms "first" and "second" are merely for the purpose of describing, and should not be construed as indicating or implying the degrees of importance or implicitly indicating the quantity of the specified technical features. Accordingly, the features defined by "first" and "second" may explicitly or implicitly comprise one or more of the features.

In the description of the present application, the description referring to the terms "an embodiment", "some embodiments", "example", "particular example" or "some examples" and so on means that particular features, structures, materials or characteristics described with reference to the embodiment or example are comprised in at least one of the embodiments or examples of the present application. In the description, the illustrative expressions of the above terms do not necessarily relate to the same embodiment or example. Furthermore, the described particular features, structures, materials or characteristics may be combined in one or more embodiments or examples in a suitable form. Moreover, subject to avoiding contradiction, a person skilled in the art may combine different embodiments or examples described in the description and the features of the different embodiments or examples.

Although the embodiments of the present application have already been illustrated and described, a person skilled in the art can understand that those embodiments may have various alterations, modifications, substitutions and variations without departing from the principle and the spirit of the present application, and the scope of the present application is defined by the claims and the equivalents thereof.

The invention claimed is:

1. An OLED display panel, wherein the OLED display panel comprises:
   a substrate;
   a pixel layer, wherein the pixel layer is disposed on one side of the substrate in a thickness direction of the substrate and comprises a plurality of pixel-unit groups, the plurality of pixel-unit groups are disposed sequentially in a first direction, each of the pixel-unit groups comprises a plurality of pixel units that are arranged in a second direction, and each of the pixel units comprises a first sub-pixel, a second sub-pixel and a third sub-pixel, wherein the second direction is perpendicular to the first direction; and
   a separating and supporting layer, wherein both of the separating and supporting layer and the pixel layer are disposed on a same one side of the substrate in the thickness direction of the substrate and are disposed on a surface of the substrate, the separating and supporting layer comprises a plurality of supporting-block groups, the plurality of supporting-block groups are disposed sequentially in the first direction, each of the supporting-block groups comprises a plurality of supporting blocks that are arranged in the second direction, a thickness of each of the supporting blocks is greater than a thickness of the third sub-pixel, when the third sub-pixel is formed by evaporation by using a mask, the supporting blocks are suitable to support between the substrate and the mask, to isolate the substrate and the mask, and a plurality of third sub-pixels of each of the pixel-unit groups are suitable to correspond to one opening of the mask;
   wherein the supporting-block groups are disposed on at least one side of the third sub-pixel of each of the pixel-unit groups in the first direction;
   wherein a plurality of first sub-pixels and a plurality of second sub-pixels of each of the pixel-unit groups are disposed sequentially alternately along a first reference line, and a plurality of third sub-pixel of each of the pixel-unit groups are disposed sequentially along a second reference line, wherein the second reference line and the first reference line are parallel and both extend in the second direction; and
   in the first direction, the supporting-block groups are disposed between the first reference line and the second reference line of each of the pixel-unit groups, and the supporting-block groups are disposed between each two neighboring pixel-unit groups.

2. The OLED display panel according to claim 1, wherein the supporting-block groups are disposed on two sides of the third sub-pixel of each of the pixel-unit groups in the first direction.

3. The OLED display panel according to claim 1, wherein in the first direction, a plurality of first reference lines and a plurality of second reference lines are disposed sequentially alternately.

4. The OLED display panel according to claim 1, wherein two supporting-block groups located on two sides of the pixel-unit groups in the first direction are a first supporting-block group and a second supporting-block group, and the supporting blocks of the first supporting-block group and corresponding supporting blocks of the second supporting-block group individually flush in the second direction.

5. The OLED display panel according to claim 1, wherein two supporting-block groups located on two sides of the pixel-unit groups in the first direction are a first supporting-block group and a second supporting-block group, and the supporting blocks of the first supporting-block group and the supporting blocks of the second supporting-block group are individually staggered in the second direction.

6. The OLED display panel according to claim 1, wherein each of the pixel units corresponds to at least one of the supporting blocks; and in the second direction, the plurality of pixel units of the pixel-unit groups and the plurality of supporting blocks of the supporting-block groups are disposed sequentially alternately; or in the second direction, one supporting block is disposed between the first sub-pixel and the second sub-pixel of each of the pixel units.

7. The OLED display panel according to claim 1, wherein the first sub-pixel is a red-color sub-pixel, the second sub-pixel is a green-color sub-pixel, and the third sub-pixel is a blue-color sub-pixel.

8. A display apparatus, wherein the display apparatus comprises the OLED display panel according to claim 1.

9. The display apparatus according to claim 8, wherein the supporting-block groups are disposed on two sides of the third sub-pixel of each of the pixel-unit groups in the first direction.

10. The display apparatus according to claim 8, wherein in the first direction, a plurality of first reference lines and a plurality of second reference lines are disposed sequentially alternately.

11. The display apparatus according to claim 8, wherein each of the pixel units corresponds to at least one of the supporting blocks; and in the second direction, the plurality of pixel units of the pixel-unit groups and the plurality of supporting blocks of the supporting-block groups are disposed sequentially alternately; or in the second direction, one supporting block is disposed between the first sub-pixel and the second sub-pixel of each of the pixel units.

\* \* \* \* \*